(12) United States Patent
Suehiro et al.

(10) Patent No.: US 9,653,661 B2
(45) Date of Patent: May 16, 2017

(54) LIGHT-EMITTING DEVICE, METHOD OF MANUFACTURING THE SAME, METHOD OF MOUNTING THE SAME AND LIGHTING DEVICE

(75) Inventors: Yoshinobu Suehiro, Kiyosu (JP); Seiji Yamaguchi, Kiyosu (JP); Katsunori Arakane, Kiyosu (JP); Koji Tasumi, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 12/926,253

(22) Filed: Nov. 4, 2010

(65) Prior Publication Data

US 2011/0114989 A1 May 19, 2011

(30) Foreign Application Priority Data

Nov. 19, 2009 (JP) ................ 2009-264095
Mar. 18, 2010 (JP) ................ 2010-062514

(51) Int. Cl.
*H01L 21/603* (2006.01)
*H01L 33/56* (2010.01)
(Continued)

(52) U.S. Cl.
CPC .............. *H01L 33/56* (2013.01); *H01L 24/97* (2013.01); *H01L 33/54* (2013.01);
(Continued)

(58) Field of Classification Search
USPC ......................................................... 257/99
See application file for complete search history.

(56) References Cited

U.S. PATENT DOCUMENTS 5,298,768 A    3/1994   Okazaki et al.
6,392,294 B1   5/2002   Yamaguchi
(Continued)

FOREIGN PATENT DOCUMENTS

JP    2000-188358 A    7/2000
JP    2000-200927 A    7/2000
(Continued)

OTHER PUBLICATIONS

Japanese Office Action dated Jul. 2, 2013 with partial English translation thereof.
(Continued)

*Primary Examiner* — Abul Kalam
(74) *Attorney, Agent, or Firm* — McGinn IP Law Group, PLLC.

(57) ABSTRACT

A method of manufacturing a light-emitting device includes a hole forming process for forming a through-hole that continues from a front surface to a back surface of a mounting substrate, a pattern forming process for continuously forming a circuit pattern on an inner surface of the through-hole in the mounting substrate, from an end portion of the through-hole on the front surface of the mounting substrate to a mounting portion of a light-emitting element, and on a periphery of the through-hole on the back surface of the mounting substrate, a mounting process for mounting the light-emitting element on the mounting portion, and a hot pressing process in that an inorganic material softened by heating is placed on the surface of the mounting substrate and is advanced into the through-hole while sealing the light-emitting element by pressing and bonding the inorganic material to the surface of the mounting substrate.

19 Claims, 20 Drawing Sheets

(51) Int. Cl.
H01L 33/54 (2010.01)
H01L 23/00 (2006.01)
H01L 25/075 (2006.01)
H01L 33/48 (2010.01)

(52) U.S. Cl.
CPC ........ *H01L 25/0753* (2013.01); *H01L 33/486* (2013.01); *H01L 2224/16225* (2013.01); *H01L 2924/01322* (2013.01); *H01L 2924/15747* (2013.01); *H01L 2924/15787* (2013.01); *H01L 2924/181* (2013.01); *H01L 2933/005* (2013.01)

(56) References Cited

U.S. PATENT DOCUMENTS

| | | | |
|---|---|---|---|
| 6,400,172 B1* | 6/2002 | Akram et al. | 324/756.05 |
| 6,949,771 B2* | 9/2005 | Yoganandan et al. | 257/99 |
| 7,683,470 B2* | 3/2010 | Lee et al. | 257/687 |
| 2002/0163006 A1* | 11/2002 | Yoganandan et al. | 257/81 |
| 2005/0151142 A1* | 7/2005 | Imai | 257/81 |
| 2005/0161771 A1 | 7/2005 | Suehiro et al. | |
| 2005/0258552 A1* | 11/2005 | Kim | 257/787 |
| 2006/0243990 A1* | 11/2006 | Suzuki | 257/81 |
| 2006/0261364 A1 | 11/2006 | Suehiro et al. | |
| 2007/0090510 A1 | 4/2007 | Tseng et al. | |
| 2009/0029494 A1 | 1/2009 | Tseng et al. | |
| 2009/0078956 A1 | 3/2009 | Tseng et al. | |
| 2011/0169034 A1 | 7/2011 | Tseng et al. | |

FOREIGN PATENT DOCUMENTS

| | | |
|---|---|---|
| JP | 2002-335020 A | 11/2002 |
| JP | 2009-059883 A | 3/2009 |
| JP | 2009-105409 A | 5/2009 |
| WO | WO 2004/082036 A1 | 9/2004 |

OTHER PUBLICATIONS

Japanese Office Action dated Mar. 25, 2014 with a partial English Translation.

* cited by examiner

LIGHT-EMITTING DEVICE, METHOD OF MANUFACTURING THE SAME, METHOD OF MOUNTING THE SAME AND LIGHTING DEVICE

The present application is based on Japanese Patent Application No. 2010-062514 filed on Mar. 18, 2010, the entire contents of which are incorporated herein by reference.

BACKGROUND OF THE INVENTION

1. Field of the Invention

The invention relates to a light-emitting device that a light-emitting element is mounted on the surface of a mounting substrate and sealed with an inorganic material, a method of manufacturing the same, a method of mounting the same and a lighting device equipped with the same.

2. Description of the Related Art

Conventionally, a method of manufacturing an electronic component is known in which multiple electronic component elements are placed on an insulating substrate, an assembly of the bonded electronic component elements are collectively sealed with resin and is subsequently separated into individual electronic components by dicing (see JP-A 2000-200927). This method includes an insulating substrate manufacturing process for manufacturing an insulating substrate for multi-cavity molding in which multiple circuit patterns connecting electronic component elements are formed in parallel on a front side of an insulating substrate and each circuit pattern is connected to multiple through-holes arranged in parallel, a protective film adhesion process in which a protective film is adhered to a back side of the insulating substrate of the electronic component element assembly and an adherent material is pushed into the through-hole by pressing the protective film against the insulation substrate to fill the through-hole with the adherent material, a bonding process in which multiple electronic component elements are placed and bonded to the circuit patterns provided on the front side of the insulating substrate to manufacture the electronic component element assembly, a resin sealing process in which the front side of the electronic component element assembly having the protective film adhered thereon is collectively sealed with resin, a protective film removal process for removing the protective film, and a dicing process in which the electronic component element assembly of which front side is sealed with resin and the protective film on the back side is removed is separated into individual electronic components by dicing.

Meanwhile, a light-emitting device in which a light-emitting element on a mounting substrate is sealed with an inorganic material such as glass is known (see, e.g., International Publication WO2004/82036). In the light-emitting device described in WO2004/82036, plural light-emitting elements are mounted on a mounting substrate followed by a hot pressing process of glass, thereby collectively sealing each of the light-emitting elements with the glass. This makes the glass less likely to separate from the mounting substrate since the mounting substrate is directly bonded to the glass. Significantly high strength has been realized in this light-emitting device compared with using a conventional resin material.

However, the method described in JP-A 2000-200927 has a problem that the sealing material of resin is likely to deteriorate and the air tends to be caught in the sealing member during the resin sealing process.

In the light-emitting device described in WO2004/82036, gas between the inorganic material and the mounting substrate may be left at the time of the hot pressing process so as to generate a residual gas layer therebetween. Thus, it may need to conduct the process in a reduced-pressure atmosphere or provide a mechanism etc. to remove the gas.

SUMMARY OF THE INVENTION

In the conventional light-emitting device, when a force is applied to the glass sealing portion in a direction separating from the mounting substrate, the glass sealing portion may separate (or peel off) from the mounting substrate due to the residual gas layer between the inorganic material and the mounting substrate.

It is an object of the invention to provide a light-emitting device that a glass sealing portion thereof is less likely to separate (or peel off) from a mounting substrate even when a force is applied to the glass sealing portion in a direction separating from the mounting substrate. It is a further object of the invention to provide a method of manufacturing the light-emitting device, a method of mounting the light-emitting device and a lighting device equipped with the light-emitting device.

(1) According to one embodiment of the invention, a method of manufacturing a light-emitting device, the light-emitting device comprising a light-emitting element mounted on a surface of a mounting substrate and sealed with an inorganic material, comprises:

a hole forming process for forming a through-hole that continues from a front surface to a back surface of the mounting substrate;

a pattern forming process for continuously forming a circuit pattern on an inner surface of the through-hole in the mounting substrate, from an end portion of the through-hole on the front surface of the mounting substrate to a mounting portion of the light-emitting element, and on a periphery of the through-hole on the back surface of the mounting substrate;

a mounting process for mounting the light-emitting element on the mounting portion of the mounting substrate; and a hot pressing process in that the inorganic material softened by heating is placed on the surface of the mounting substrate and is advanced into the through-hole while sealing the light-emitting element by pressing and bonding the inorganic material to the surface of the mounting substrate.

In the above embodiment (1) of the invention, the following modifications and changes can be made.

(i) The through-hole formed in the hole forming process comprises a diameter enlarging portion that has a diameter enlarged toward a back surface side, and the inorganic material is advanced at least into the diameter enlarging portion of the through-hole in the hot pressing process.

(ii) The inorganic material does not reach an end portion of the through-hole on the back side in the hot pressing process.

(iii) A plurality of the light-emitting elements are mounted on the mounting substrate, and the method comprises a dividing process for dividing the inorganic material and the mounting substrate after solidification of the inorganic material that is softened in the hot pressing process.

(2) According to another embodiment of the invention, a light-emitting device comprises:

a light-emitting element mounted on a surface of a mounting substrate and sealed with an inorganic material;

a through-hole that continues from a front surface to a back surface of the mounting substrate;

a circuit pattern continuously formed on an inner surface of the through-hole in the mounting substrate, from an end portion of the through-hole on the front surface of the mounting substrate to a mounting portion of the light-emitting element, and on a periphery of the through-hole on the back surface of the mounting substrate; and an inorganic sealing portion that seals the light-emitting element on the surface of the mounting substrate and comprises an engaging portion advanced into the through-hole.

In the above embodiment (2) of the invention, the following modifications and changes can be made.

(iv) The though-hole formed in the hole forming process comprises a diameter enlarging portion that has a diameter enlarged toward a back surface side, and the inorganic sealing portion comprises an engaging portion that is advanced into the diameter enlarging portion of the through-hole.

(3) According to another embodiment of the invention, a method of mounting a light-emitting device comprises:

mounting the light-emitting device according to the embodiment (2) on a mounting board; and bonding, via a solder or directly, the circuit pattern formed at the periphery of the through-hole on the back surface of the mounting substrate of the light-emitting device to a circuit pattern on the mounting board.

(4) According to another embodiment of the invention, a lighting device comprises:

the light-emitting device according to the embodiment (2);

a mounting board for mounting the light-emitting device; and a solder comprising an intruded portion interposed between the circuit pattern formed at the periphery of the through-hole on the back surface of the mounting substrate of the light-emitting device and the circuit pattern of the mounting board, the intruded portion being intruded into the through-hole.

POINTS OF THE INVENTION

According to one embodiment of the invention, a light-emitting device is manufactured such that a glass material enters a through-hole continuing from a front surface to a back surface of a mounting substrate on which to mount a light emitting element (LED element) in a hot pressing process for forming a glass sealing portion, and the glass material-entered portion becomes an engaging portion after solidification of the glass material to allow the glass sealing portion to be tightly fixed to the mounting substrate. Thereby, the glass sealing portion is less likely to separate from the mounting substrate even when a force is applied to the glass sealing portion in a direction separating from the mounting substrate since the engaging portion is caught in the through-hole. Therefore, the light-emitting device can be used in a harsh environment, so that the reliability can be significantly improved.

BRIEF DESCRIPTION OF THE DRAWINGS

Next, the present invention will be explained in more detail in conjunction with appended drawings, wherein.

DETAILED DESCRIPTION OF THE PREFERRED EMBODIMENTS

Figure 1:
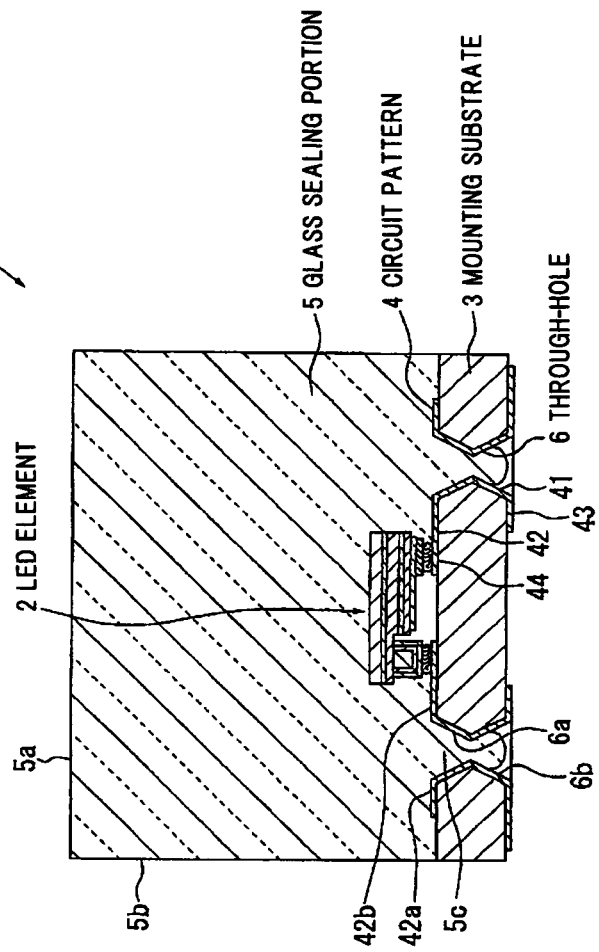
FIG. 1 is a schematic vertical cross sectional view showing a light-emitting device in a preferred embodiment of the present invention.

FIGS. 1 to 8 show an embodiment of the invention and FIG. 1 is a schematic vertical cross sectional view showing a light-emitting device. It should be noted that the size of each portion is different from the actual size in each of the drawings in order to clearly show the configuration of each portion.

As shown in FIG. 1, a light-emitting device 1 has a flip-chip-type LED element 2 formed of a GaN-based semiconductor material, a mounting substrate 3 for mounting the LED element 2, a circuit pattern 4 formed on the mounting substrate 3, and a glass sealing portion 5 as an inorganic sealing portion which seals the LED element 2 and is adhered to the mounting substrate 3. In addition, a hollow portion, to where glass does not enter, is formed between the LED element 2 and the mounting substrate 3.

A through-hole 6 continuing from a front surface to a back surface is formed in the mounting substrate 3. In the present embodiment, the through-hole 6 is each formed on an anode side and a cathode side, and each through-hole 6 has a diameter reducing portion 6a formed on the front side and a diameter enlarging portion 6b formed on the back side. The diameter reducing portion 6a is formed in the through-hole 6 from the end portion thereof on the front side of the mounting substrate 3 to a center in a thickness direction so that the diameter is narrowed toward the back side. The diameter enlarging portion 6b is formed in the through-hole 6 from the end portion thereof on the back side of the mounting substrate 3 to a center in a thickness direction so that the diameter is widened toward the back side. The diameter reducing portion 6a and the diameter enlarging portion 6b are respectively narrowed and widened in a thickness direction at a constant rate.

The circuit pattern 4 continuously includes an inner surface pattern 41 formed on the inner surface of the through-hole 6 in the mounting substrate 3, a front surface pattern 42 formed on the front surface of the mounting substrate 3 and electrically connected to the LED element 2, and a back surface pattern 43 formed on the back surface of the mounting substrate 3 and being connectable to an external terminal. The circuit pattern 4 may have a three-layered structure composed of, e.g., a W-layer, a Ni layer and an Au layer. The front surface pattern 42 has a circular portion 42a formed at a periphery of the end portion of the through-hole 6 on the front side and a connecting portion 42b extending from the circular portion 42a to a mounting portion 44 of the LED element 2 located on the substrate center side. Meanwhile, the back surface pattern 43 is formed in a circular shape at a periphery of the end portion of the through-hole 6 on the back side. The inner surface pattern 41 is formed on the entire inner surface of the through-hole 6.

Figure 2:
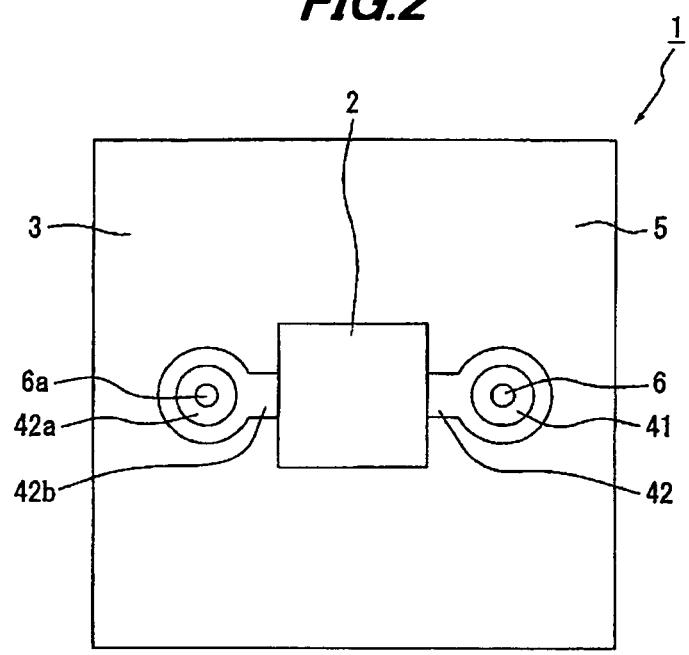
FIG. 2 is a schematic plan view showing a light-emitting device.

FIG. 2 is a schematic plan view showing a light-emitting device.

The mounting substrate 3 is formed of a polycrystalline sintered material of alumina ($Al_2O_3$), is formed 0.25 mm thick in 1.0 mm square, and has a thermal expansion coefficient α of $7 \times 10^{-6}$/° C. Meanwhile, the LED element 2 is formed 100 μm thick in 346 μm square, and a thermal expansion coefficient thereof is $7 \times 10^{-6}$/° C. Here, the thermal expansion coefficient of a GaN layer of the LED element 2 is $5 \times 10^{-6}$/° C., however, since the thermal expansion coefficient of the growth substrate formed of sapphire which is the majority component is $7 \times 10^{-6}$° C., the thermal expansion coefficient of the main body of the LED element 2 is equivalent to that of the growth substrate. Each of the through-holes 6 is arranged such that the LED element 2 mounted on the middle of the mounting substrate 3 is sandwiched when viewed from the top. In the present embodiment, two through-holes 6 are arranged in a direction parallel to one side of the mounting substrate 3 (in a width direction) so as to sandwich the LED element 2.

Figure 3:
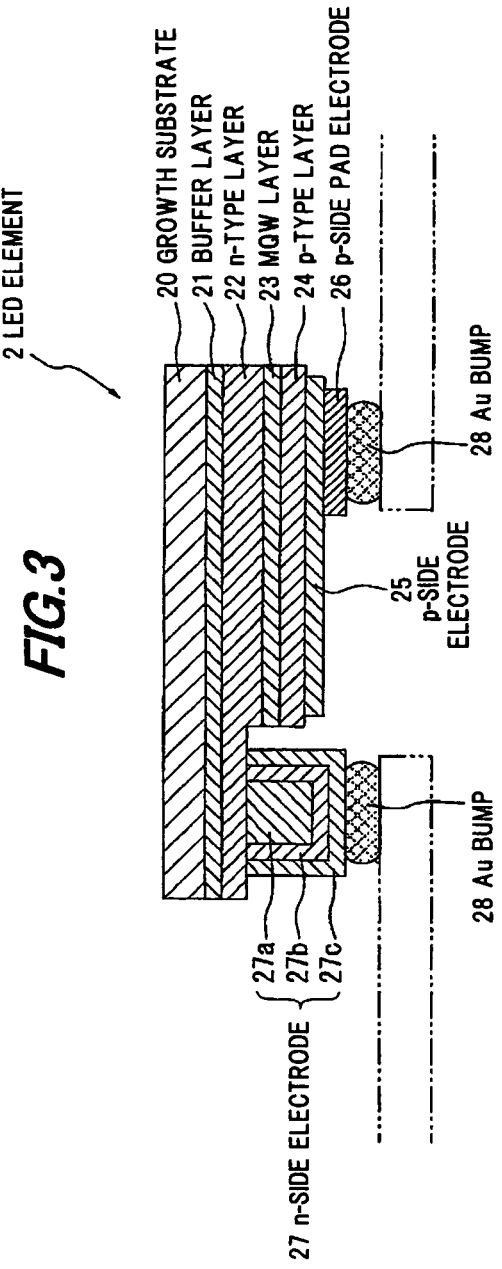
FIG. 3 is a vertical cross-sectional pattern diagram showing a LED element.

FIG. 3 is a vertical cross-sectional pattern diagram showing a LED element.

As shown in FIG. 3, a buffer layer 21, an n-type layer 22, a MQW layer 23 and a p-type layer 24 are formed in the LED element 2 as a light-emitting element in this order by epitaxially growing a Group III nitride-based semiconductor on a surface of a growth substrate 20 which is formed of sapphire ($Al_2O_3$). The LED element 2 is epitaxially grown at 700° C. or more, has a heat resistance temperature of 600° C. or more, and is stable at the processing temperature during the sealing process using the below-described low-melting point glass. In addition, the LED element 2 has a p-side electrode 25 provided on a surface of the p-type layer 24, a p-side pad electrode 26 formed on the p-side electrode 25 and an n-side electrode 27 formed on the n-type layer 22 which is exposed by partially etching from the p-type layer 24 to the n-type layer 22. An Au bump 28 is each formed on the p-side pad electrode 26 and on the n-side electrode 27.

The p-side electrode 25 is formed of, e.g., silver (Ag), and functions as a light reflection layer for reflecting the light emitted from the MQW layer 23 as a light emitting layer toward a direction of the growth substrate 20. It should be noted that it is possible to appropriately change the material of the p-side electrode 25. In the present embodiment, two p-side pad electrodes 26 are formed on the p-side electrode 25 and the Au bump 28 is formed on each p-side pad electrode 26. Alternatively, there may be, e.g., three p-side pad electrodes 26, and the number of the p-side pad electrodes 26 formed on the p-side electrode 25 can be appropriately changed.

The n-side electrode 27 has a contact layer and a pad layer formed in the same area. As shown in FIG. 3, the n-side electrode 27 is composed of an Al layer 27a, a thin film Ni layer 27b covering the Al layer 27a and an Au layer 27c covering a surface of the Ni layer 27b. It should be noted that it is possible to appropriately change the material of the n-side electrode 27. In the present embodiment, when viewed from the top, the n-side electrode 27 is formed at a corner of the LED element 2 and the p-side electrode 25 is formed on the substantially whole surface except a formation region of the n-side electrode 27.

The glass sealing portion 5 is formed of $ZnO$—$B_2O_3$—$SiO_2$-based glass. It should be noted that the glass composition is not limited thereto, for example, the glass may contain $Nb_2O_5$ in order to have a high refractive index and may contain $Na_2O$ or $Li_2O$, etc., in order to have a low melting point. In addition, $ZrO_2$ or $TiO_2$, etc., may be contained as an arbitrary component. This glass has a glass transition temperature (Tg) of 490° C. and a yielding point (At) of 520° C., and the glass transition temperature (Tg) is sufficiently lower than formation temperature during the epitaxial growth of the light emitting layer (the MQW layer 23 in the present embodiment) of the LED element 2. In the present embodiment, the glass transition temperature (Tg) is 200° C. or more lower than the epitaxial growth temperature of light emitting layer. In addition, the thermal expansion coefficient (α) of the glass at 100-300° C. is $6 \times 10^{-6}$/° C. The numerical value of the thermal expansion coefficient (α) becomes larger than the above when exceeding the glass transition temperature (Tg). As a result, the glass is adhered to the mounting substrate 3 at about 600° C. and a hot pressing process is thereby possible. In addition, a refractive index of the glass of the glass sealing portion 5 is 1.7.

In addition, the composition of the glass is arbitrary as long as the glass transition temperature (Tg) is lower than the heat resistance temperature of the LED element 2 and the thermal expansion coefficient (α) is equivalent to that of the mounting substrate 3. Glass having relatively low glass transition temperature and relatively small thermal expansion coefficient includes, e.g., $ZnO$—$SiO_2$—$R_2O$-based glass (R is at least one selected from Group I elements such as Li, Na and K), phosphoric acid-based glass and lead glass. Among these glasses, the $ZnO$—$SiO_2$—$R_2O$-based glass is suitable since it is good in moisture resistance as compared to the phosphoric acid-based glass and the environmental problem does not occur unlike the lead glass.

Here, in the present embodiment, the glass used for sealing the LED element 2 is glass formed in a state softened by heating, which is different from glass formed by sol-gel method. Since volume variation during the formation is large in the sol-gel glass, cracks are likely to be generated and it is thereby difficult to form a thick film of the glass, however, it is possible to avoid the problem in the glass which is softened by heating and fused to the mounting substrate 3 as in the present embodiment. In addition, air-tightness may be lost due to generation of micropores in the sol-gel glass, however, such a problem does not occur in the glass of the present embodiment and it is possible to accurately seal the LED element 2.

In addition, the glass of the present embodiment is processed at an incomparably higher viscosity than a viscosity level which is generally regarded as a high viscosity in resins. Furthermore, in the case of glass, even when the temperature exceeds the yield point by several tens of degrees, the viscosity is not lowered to the level of the general resin sealing. In addition, in order to have the viscosity level of the general resin formation, a temperature above the crystal growth temperature of the LED element is required or adhesion to the die occurs, and the sealing/forming process becomes difficult. Thus, processing at not less than $10^4$ poises and not more than $10^9$ poises is preferred.

As shown in FIG. 1, the glass sealing portion 5 entirely covers the LED element 2 and the mounting substrate 3, and has a thickness of 0.5 mm. The glass sealing portion 5 has an upper surface 5a parallel to the mounting substrate 3 and a side surface 5b extending downwardly from an outer edge of the upper surface 5a and being vertical to the mounting substrate 3. In addition, the glass sealing portion 5 has an engaging portion 5c which enters inside the through-hole 6 of the mounting substrate 3. The engaging portion 5c is formed beyond the diameter reducing portion 6a to the middle portion of the diameter enlarging portion 6b. The engaging portion 5c is formed not to reach the end portion of the through-hole 6 on the back side.

In the light-emitting device 1 configured as mentioned above, when the voltage is applied to the LED element 2 through the circuit pattern 4, blue light is emitted from the LED element 2. The blue light emitted from the LED element 2 is radiated to outside through the upper surface 5a or the side surface 5b of the glass sealing portion 5.

The light-emitting device 1 is manufactured through the following processes.

Firstly, oxide powder as a glass component is heated to 1200° C. and is stirred in a molten state. Then, after the glass is solidified, a pre-sealing glass 11 is processed into a plate shape by slicing so as to correspond to a thickness of the glass sealing portion 5 (plate shape forming process). After this, concave portions 11a corresponding to each LED element 2 are formed on the pre-sealing glass 11, as is described later.

Meanwhile, the through-hole 6 is formed in the plate-like mounting substrate 3 by a sandblasting process or a laser process, etc. (a hole forming process). The diameter reducing portion 6a and the diameter enlarging portion 6b can be formed by changing a scattering angle of abrasive for the sandblasting process, and by changing a converging angle of laser for the laser process.

After the through-hole 6 is formed, the circuit pattern 4 is formed on the mounting substrate 3 (pattern forming process). The inner surface pattern 41, the front surface pattern 42 and the back surface pattern 43 are continuously formed in the pattern forming process. For example, metal paste is screen printed, the mounting substrate 3 is heated at a predetermined temperature (e.g., 1000° C. ore more) to bake the metal thereon and other metal is plated on the aforementioned metal, thereby forming the circuit pattern 4. Alternatively, metal may be deposited on the mounting substrate 3 followed by plating of other metal, or, metal may be adhered and etched in a predetermined shaped followed by plating of other metal.

After this, plural LED elements 2 are mounted on the mounting portion 44 of the mounting substrate 3 at equal intervals vertically and horizontally (mounting process). In details, the plural LED elements 2 are electrically connected to the front surface pattern 41 of the circuit pattern 4 on the mounting substrate 3 by each of the Au bumps 28. In the present embodiment, three bump connections are provided in total, two of which are on a p-side and one of which is on an n-side. In addition, the mounting substrate 3 has a trench 31 as an area increasing portion (see FIG. 4) which is formed on the outside of a mounting region of the LED element 2. Double trenches 31 are formed in the present embodiment.

Figure 4:
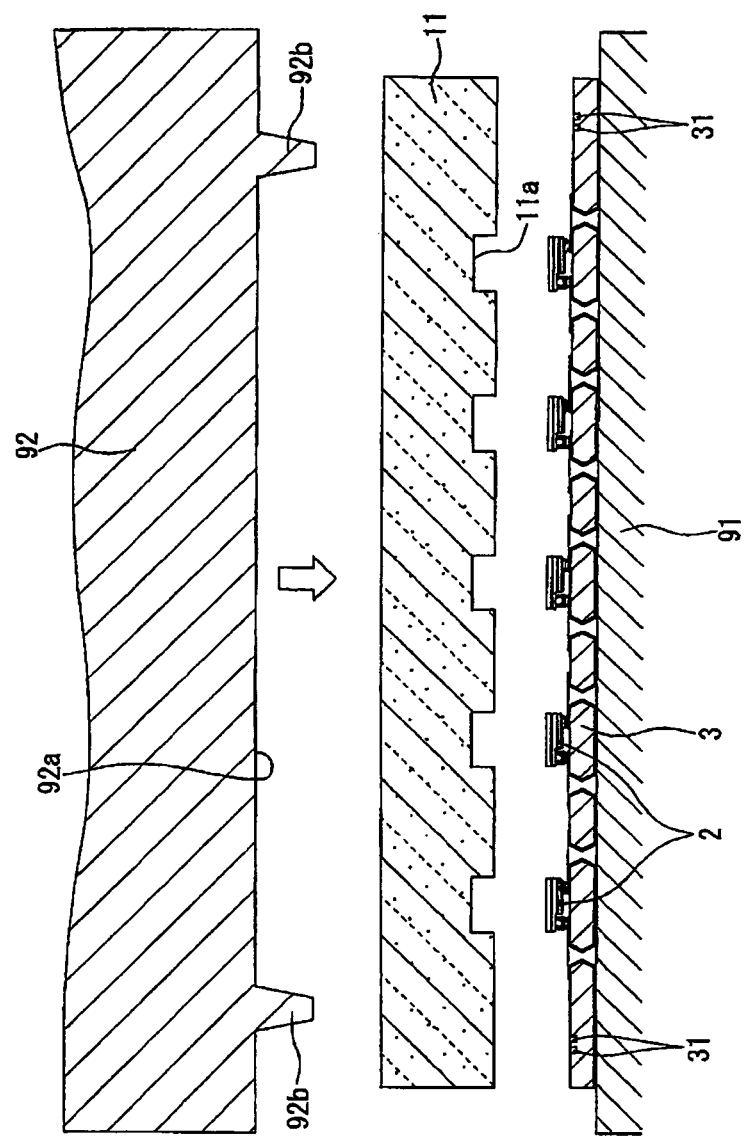
FIG. 4 is an explanatory pattern diagram showing a state of a glass material before a sealing process.

Then, as shown in FIG. 4, the mounting substrate 3 having LED elements 2 each mounted thereon is set on a lower die 91, an upper die 92 is arranged so as to face the mounting surface of the mounting substrate 3, and the pre-sealing glass 11 is placed between the mounting substrate 3 and the upper die 92 so as to cover the mounting region of the LED element 2 (press preparation process). At this time, the pre-sealing glass 11 may be in contact with each of the LED elements 2 or may be separated therefrom. A heater is each arranged in the lower die 91 and the upper die 92, and the temperature of the lower die 91 and the upper die 92 is adjusted independently. The upper die 92 has a flat surface 92a which contacts with the pre-sealing glass located above each of the LED elements 2, and an outflow control portion 92b formed at an outer rim of the flat surface 92a in a downwardly protruding manner. In the present embodiment, the outflow control portion 92b is a protrusion of which surface on the LED element 2 side is oblique so as to be thinned toward the tip portion thereof. The upper die 92 is formed of, e.g., stainless or tungsten carbide, etc. In the present embodiment, the outflow control portion 92b of the upper die 92 is formed in a square-ring shape when viewed from the bottom.

Figure 5:
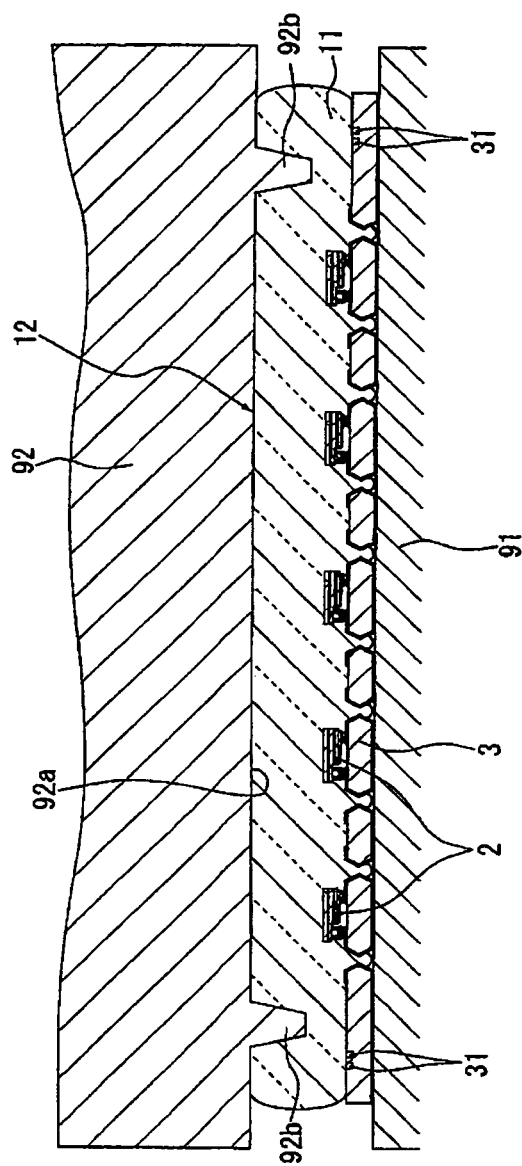
FIG. 5 is an explanatory pattern diagram showing a state of the glass material during the sealing process.

In the present embodiment, the pre-sealing glass 11 is formed in a plate-like shape having concave portions 11a on the mounting substrate 3 side so as to correspond to each of the LED elements 2. After this, pressure is applied on the lower die 91 and the upper die 92 and a hot pressing process is performed in a nitrogen atmosphere on the glass material which is softened by heating (hot pressing process). As shown in FIG. 5, in the hot pressing process, while the LED element 2 is sealed by pressing and bonding the glass material to the surface of the mounting substrate 3, the glass material is advanced at least into the diameter enlarging portion 6b of the through-hole 6. Here, gas between the pre-sealing glass 11 and the mounting substrate 3 is eliminated to the outside through the through-hole 6. FIG. 5 is an explanatory pattern diagram showing a state of the glass material during the sealing process. In the present embodiment, the softened glass material enters the middle portion of the diameter enlarging portion 6b but does not reach the back side of the mounting substrate 3. Any problem does not occur in the sealing process itself of the LED element 2 even though the glass material reaches the back side of the mounting substrate 3, however, there is a possibility that the glass material adheres to the lower die 91. The processing conditions at this time can be arbitrarily changed depending on temperature and pressure of the glass and a diameter of the through-hole, etc., for example, glass temperature of 600° C., glass pressure of 25 kgf/cm$^2$ and through-hole diameter of 0.1 mm. Alternatively, the pre-sealing glass 11 may be heated before or after being placed on the mounting substrate 3 as long as pre-sealing glass 11 in a state of being softened by heating is placed on the surface of the mounting substrate 3 at the time of pressing.

Here, the hot pressing process only needs to be performed in an atmosphere which is inert to each member for preventing oxidation of each portion of the apparatus including the lower die 91 and the upper die 92, and it may be performed in, e.g., vacuum other than the nitrogen atmosphere. The hot pressing process may be performed in the air when the oxidation of each portion of the apparatus including the lower die 91 and the upper die 92 does not arises any problems.

As shown in FIG. 5, the pre-sealing glass 11 softened by heating generally outflows in a horizontal direction when the flat surface 92a of the upper die 92 comes completely into contact with the upper surface of the pre-sealing glass 11, however, the outflow control portion 92b of the upper die 92 controls the outflow of the pre-sealing glass 11 and the pressure of the glass can be constant inside the outflow control portion 92b. At the time of the pressing process, the softened glass material behaves as fluid with high viscosity and is compressed by the upper die 92 and the mounting substrate 3. If the gap between the upper die 92 and the mounting substrate 3 is constant from the center side to the outer rim side, it becomes a state in which a pressure difference is likely to occur between the outer rim side and the center side. However, a cavity is formed inside while the outflow direction of the glass material is restricted by providing the outflow control portion 92b, and the pressure of the glass in the vicinity of each LED element 2 can be thereby substantially constant. In other words, the manufacturing method in the present embodiment solves a new problem which occurs in the sealing of each of the LED elements 2 by the hot pressing process using high-viscosity glass. In the present embodiment, an excessive glass material flows out to the outside of the outflow control portion 92b since the tip portion of the outflow control portion 92b is not in contact with the mounting substrate 3. As a result, it is possible to avoid an excessive pressure increase in the glass material in the cavity.

As shown in FIG. 5, the entire upper surface of the pre-sealing glass 11 is formed flat by the flat surface 92a. Meanwhile, the softened glass material enters each of the trenches 31 of the mounting substrate 3 and is bonded to the surface of each trench 31. Here, each of the trenches 31 is located outside of the outflow control portion 92b.

Figure 6:
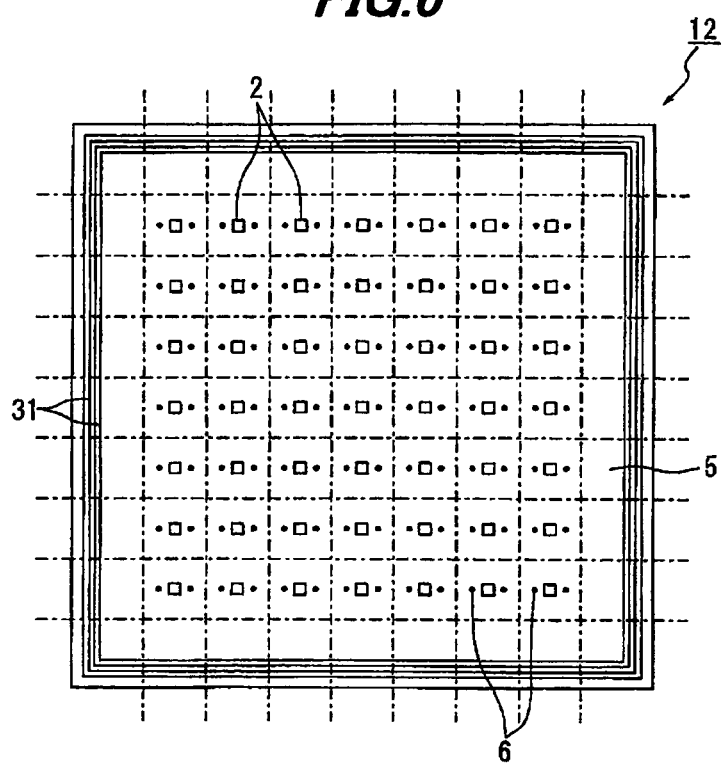
FIG. 6 is a plan view of an intermediary body.

An intermediary body 12 shown in FIG. 6 in a state that plural light-emitting devices 1 are coupled in vertical and horizontal directions is made by the above-mentioned processes. After this, the mounting substrate 3 integrated with the glass sealing portion 5 is placed on a dicing apparatus, dicing is performed by a dicing blade so as to divide the glass sealing portion 5 and the circuit board 3 per each LED element 2, thereby completing the light-emitting device 1 (dividing process).

In the method of manufacturing the light-emitting device 1 described above, since the glass material enters the diameter enlarging portion 6b at the time of hot pressing, the entered portion becomes the engaging portion 5c after solidification of the glass material and the glass sealing portion 5 is tightly fixed to the mounting substrate 3. As a result, the glass sealing portion 5 is not separated from the mounting substrate 3 even if a force in a direction separating from the mounting substrate 3 is applied to the glass sealing portion 5 since the engaging portion 5c is caught in the through-hole 6. Therefore, it is possible to use in, e.g., harsh environment such as high-pressure in which a resin-sealed light-emitting device cannot be used in general, and reliability is significantly improved.

In addition, since the glass sealing portion 5 is divided after the solidification of the glass material in the present embodiment, a load is applied to the glass sealing portion 5 at the time of dividing. The engaging portion 5c of the glass sealing portion 5 is formed at this time and the glass sealing portion 5 is tightly fixed to the mounting substrate 3, thus, separation of the glass at the time of dividing can be suppressed and it is possible to improve the yield. Furthermore, since separation is less likely to occur compared with a conventional product, it is possible, e.g., to use a coarse dicing blade for dicing and to increase the rotation rate, and it is thereby possible to reduce the time required for the dividing process and to improve the productivity of the light-emitting device 1.

Additionally, the gas between the glass material covering each LED element 2 of the light-emitting device 1 and the mounting substrate 3 can be eliminated to the outside at the time of hot pressing by forming the through-hole 6 in each light-emitting device 1, the good bonded state is obtained by preventing generation of the residual gas layer between the glass sealing portion 5 and the mounting substrate 3, and this also enables to improve strength. Furthermore, it is not necessary to seal in the reduced-pressure atmosphere or to provide a mechanism, etc., for eliminating the gas between the glass material and the mounting substrate 3, and it is thus possible to reduce the manufacturing cost.

According to the experiment by the inventors, it has been confirmed that a satisfactory bonded state is also realized without generation of the residual gas layer at a bonded surface of the glass material to the mounting substrate when a plate glass is bonded to a mounting substrate in which 100 pieces (10×10) or more of 0.34 mm squared LED elements are arrayed at a pitch of 1.1 mm. The surface area of the mounting substrate in this experiment was 123.21 mm$^2$ (11.1 mm×11.1 mm) including a margin for dicing. As described above, 100 pieces or more of light-emitting devices can be sealed in one glass sealing process. Additionally, it has been confirmed that the residual gas layer is not generated between the glass material and the mounting substrate when a plate glass is bonded to a mounting substrate in which 784 pieces (28×28) or more of 0.34 mm squared LED elements are arrayed at a pitch of 1.1 mm.

Here, the glass material is chemically bonded to the mounting substrate 3 made of aluminum via an oxygen compound by an anchor effect. The bonded surface of the glass material to the mounting substrate 3 is formed on the element mounting surface (front surface) of the mounting substrate 3 so as to surround the circuit pattern 4 and it is possible to prevent the generation of the residual gas layer at the bonded surface, hence, air-tightness at the bonded portion is excellent. Still further, it is possible to prevent corrosion of the circuit pattern 4.

Furthermore, even if the glass sealing portion 5 is partially separated from the mounting substrate 3 at the outer rim of the intermediary body 12, the glass sealing portion 5 is not completely separated from the mounting substrate 3 at once in the dividing process since the softened glass material is advanced into each of the through-holes 6 and the influence of the separation is limited only to the light-emitting devices 1 near the separated portion, thereby improving the yield.

In addition, since the pressure of the glass material on the mounting region is substantially constant during the glass sealing, it is possible to increase the pressure of the glass material at the outer rim of the mounting substrate 3, the bonding strength of the glass material to the mounting substrate 3 is increased and it is possible to suppress the separation of the grass material from the mounting substrate 3. Furthermore, since the glass material enters each of the trenched 31 of the mounting substrate 3, the separation of the grass material from the mounting substrate 3 due to the end portion of the glass turned up by the dicing blade can be suppressed.

In addition, the pressure applied to each LED element 2 in the mounting region can be constant. As a result, the sealing conditions of each of the LED elements 2 can be uniform and characteristics of each LED element 2 can be thereby close to uniform. Especially in the case where each LED element 2 is mounted on the mounting substrate 3 via the Au bump 28, etc., as in the present embodiment, a gap is present between each LED element 2 and the mounting substrate 3. The state of the glass entered the gap is generally different depending on the pressure and a flowing direction of the glass and the state of the entered glass largely affects on the characteristics of the LED element 2, however, characteristic variation in each LED element 2 can be suppressed by making the state of the entered glass closer to uniform.

Figure 7:
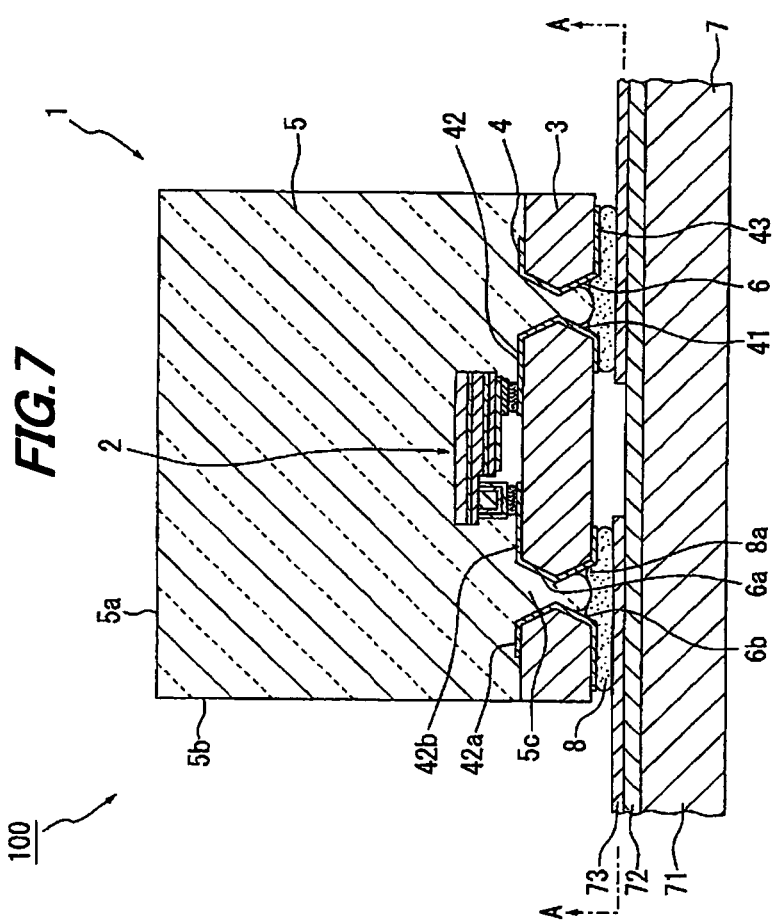
FIG. 7 is a schematic vertical cross sectional view showing a lighting device.

FIG. 7 is a schematic vertical cross sectional view showing a lighting device.

As shown in FIG. 7, the light-emitting device 1 is mounted on a mounting board 7 and can be then used as a lighting device 100. The mounting board 7 has a base portion 71 formed of metal, an insulation layer 72 on the base portion 71 and a circuit pattern 73 on the insulation layer 72. The back surface pattern 43 formed at the periphery of the through-hole 6 on the back side of the mounting substrate 3 of the light-emitting device 1 is bonded to the circuit pattern 73 of the mounting board 7 via a solder 8 for mounting the light-emitting device 1 on the mounting board 7. The solder 8 has an intruded portion 8a which is intruded into the through-hole 6. The base portion 71 is formed of, e.g., aluminum, the insulation layer 72 is formed of, e.g., resin of epoxy system, etc., or ceramic such as aluminum oxide, and the circuit pattern 73 is formed of, e.g., Ni/Au. Alternatively, besides a metal-based substrate, other substrates such as a flexible substrate and a glass-epoxy substrate, etc., formed of polyimide or liquid crystal polymer may be used as the mounting board 7.

Figure 8:
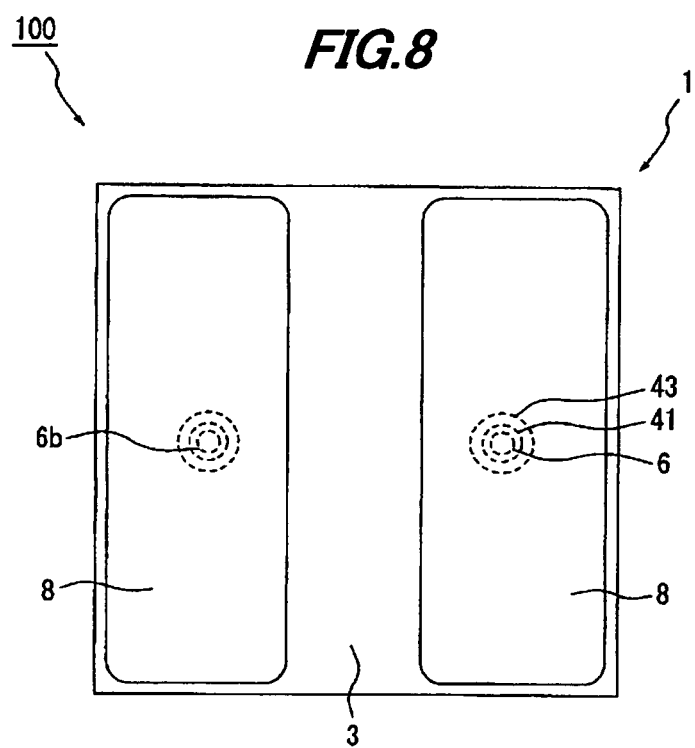
FIG. 8 is a cross sectional view taken on line A-A of FIG. 7.

FIG. 8 is a cross sectional view cut along a line A-A of FIG. 7.

As shown in FIG. 8, the solder 8 is bonded to the entire back surface pattern 43 which surrounds the through-hole 6. The solder 8 is formed so as to completely block the through-hole 6 and is configured so that the inside of the through-hole 6 is not exposed directly to the external air. This enables to suppress entrance of moisture, etc., to the inside of the light-emitting device 1 through the through-hole 6, and thus, the light-emitting device 1 can exert weather resistance. It should be noted that moisture permeability of glass or ceramic is extremely small compared with that of a resin member and it can be regarded as equal to zero in comparison with the resin. In the present embodiment, since the engaging portion 5c does not reach the back side of the through-hole 6 and the through-hole 6 has a space for accepting the solder 8, the intruded portion 8a can be formed on the solder 8 and a connecting portion can be formed not only two-dimensionally but also three-dimensionally, hence, it is possible to increase the strength of the solder bonding. In addition, a bonding defect due to aged deterioration is less likely to occur by the entrance of the solder 8 into an open hole which is less likely to receive an external force. Note that, it is not limited to the solder 8 and it is also possible to obtain the same effect by using a conductive adhesive containing metal particles such as silver paste.

Although the outflow control portion 92b provided on the upper die 92 has been described in the above-mentioned embodiment, it may be, of course, configured that an outflow control portion is provided on the mounting substrate 3 or that an outflow control portion is provided neither on the upper die 92 nor on the mounting substrate 3. Meanwhile, although the trench 31 formed on the mounting substrate 3 has been described, it may be configured to have other shapes such as a concave shape or a convex shape or the trench 31 may not be formed as long as the surface area of the mounting substrate 3 is increased. In addition, the pre-sealing glass 11 may be a flat glass on which the concave portion 11a corresponding to each LED element 2 is not formed.

Figure 9:
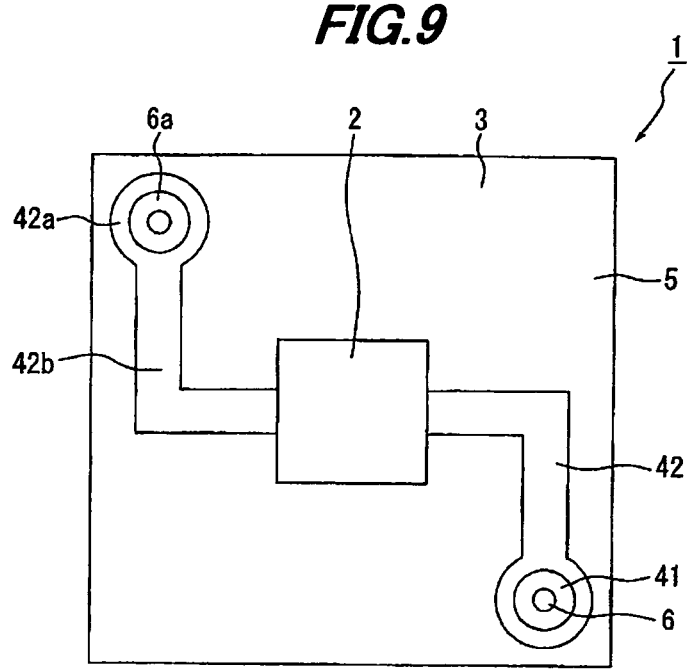
FIG. 9 is a schematic plan view showing a light-emitting device in a modification.

In addition, although two through-holes 6 arranged so as to sandwich the LED element 2 in a width direction of the mounting substrate 3 has been described in the above-mentioned embodiment, the through-holes 6 may be arranged so as to sandwich the LED element 2 e.g., in a diagonal direction of the mounting substrate 3 as shown in FIG. 9. In addition, although the through-hole 6 has a diameter of 0.1 mm as an example, it can be appropriately changed depending on viscosity or pressure of the glass, and the diameter of, e.g., not less than 0.05 mm and not more than 0.5 mm is possible as long as the glass enters the diameter enlarging portion 6b but does not reach the back surface of the mounting substrate 3 on which no LED element 2 is mounted.

Figure 10:
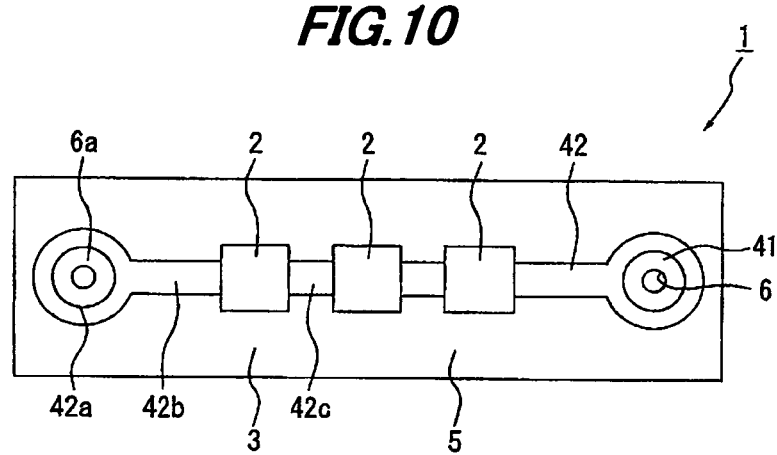
FIG. 10 is a schematic plan view showing a light-emitting device in a modification.
Figure 11:
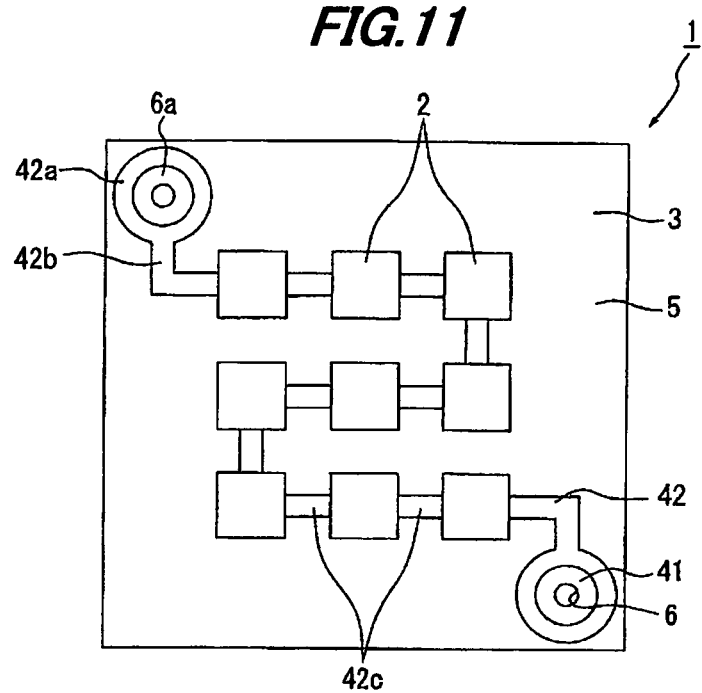
FIG. 11 is a schematic plan view a light-emitting device in a modification.

Furthermore, although one LED element 2 mounted on one light-emitting device 1 has been described in the above-mentioned embodiment, plural LED elements 2 may be mounted on one light-emitting device, for example, as shown in FIGS. 10 and 11. In the light-emitting device 1 of FIG. 10, three LED elements 2 are arranged on a line and two through-holes 6 are arranged on the same line so as to sandwich the LED elements 2. The adjacent LED elements 2 are connected by a joining portion 42c of the front surface pattern 42 and the LED elements 2 are electrically in series. In the light-emitting device 1 of FIG. 11, nine LED elements 2, three in a vertical row and three in a horizontal row, are arranged and two through-holes 6 are arranged so as to sandwich the mounting region of the LED element 2 in a diagonal direction. The LED elements 2 are electrically in series.

Figure 12:
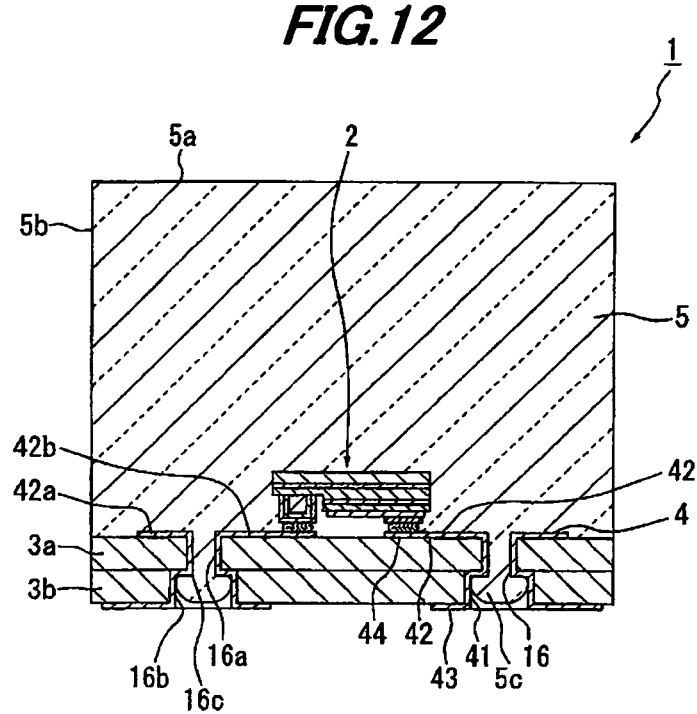
FIG. 12 is a schematic vertical cross sectional view showing a light-emitting device in a modification.

In addition, although the through-hole 6 having the diameter reducing portion 6a and the diameter enlarging portion 6b has been described in the above-mentioned embodiment, it may be a through-hole 16 which has a small diameter portion 16a on the front side and a large diameter portion 16b on the back side, for example, as shown in FIG. 12. The small diameter portion 16a and the large diameter portion 16b are formed to respectively have the same diameter in a thickness direction of the mounting substrate 3, and a boundary portion 16c between the small diameter portion 16a and the large diameter portion 16b forms a diameter enlarging portion. Then, glass of the glass sealing portion 5 enters the through-hole beyond the diameter enlarging portion, thereby forming the engaging portion 5c. In this light-emitting device 1, a multilayer ceramic substrate is used as the mounting substrate 3, the small diameter portion 16a is formed in a first layer 3a and the large diameter portion 16b is formed in a second layer 3b. The small diameter portion 16a and the large diameter portion 16b are formed by punching, using cutting dies with different diameters.

Figure 13:
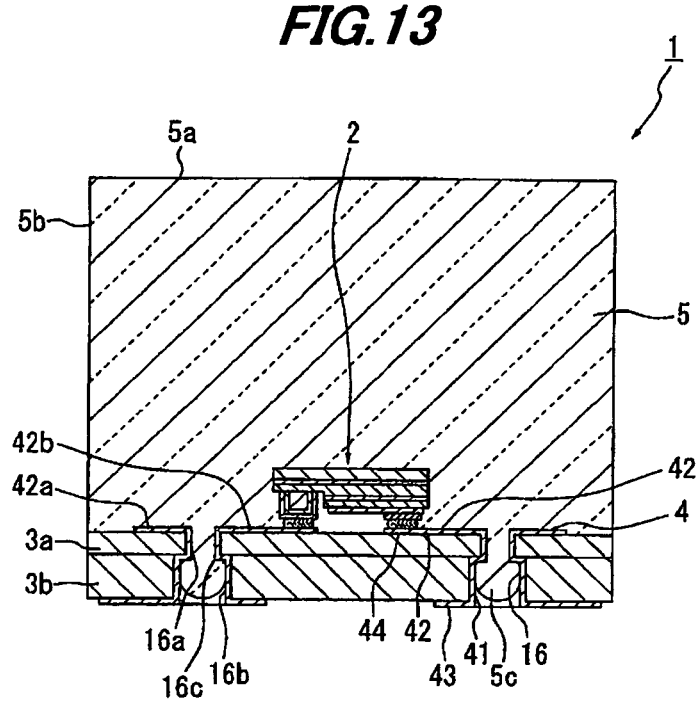
FIG. 13 is a schematic vertical cross sectional view showing a light-emitting device in a modification.

Here, the first layer 3a and the second layer 3b of the light-emitting device 1 of FIG. 12 have the same thickness, however, the first layer 3a on the front side may be thinner than the second layer 3b on the back side, for example, as shown in FIG. 13. In this case, it is possible to increase the distance from the boundary portion 16c to the back surface of the mounting substrate 3 and a space in the through-hole 6 is increased. This can make the glass entered the through-hole 6 relatively difficult to reach the back side of the mounting substrate 3 during the hot pressing process and it is advantageous in practical use.

Figure 14:
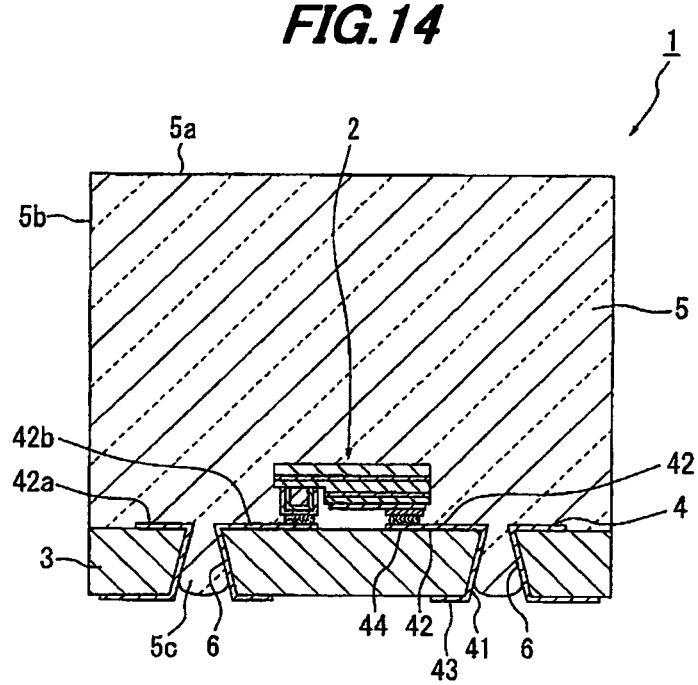
FIG. 14 is a schematic vertical cross sectional view showing a light-emitting device in a modification.

Alternatively, it may be configured that the through-hole 6 has only the diameter enlarging portion 6b without including the diameter reducing portion 6a, for example, as shown in FIG. 14. In addition, the structure, in which the diameter reducing portion 6a is relatively thin and the diameter enlarging portion 6b is relatively thick, is possible. In the light-emitting device 1 of FIG. 14, since the inner surface of the through-hole 6 is inclined at a constant angle, the stress is split so as to be easily dispersed when the load is applied to the mounting substrate 3 and a crack, etc., is thus less likely to be generated, and the engaging portion 5c of the glass in the through-hole 6 can be formed relatively smooth. In addition, this case can also make the glass entered the through-hole 6 relatively difficult to reach the back side of the mounting substrate 3 during the hot pressing process of the glass.

Figure 15:
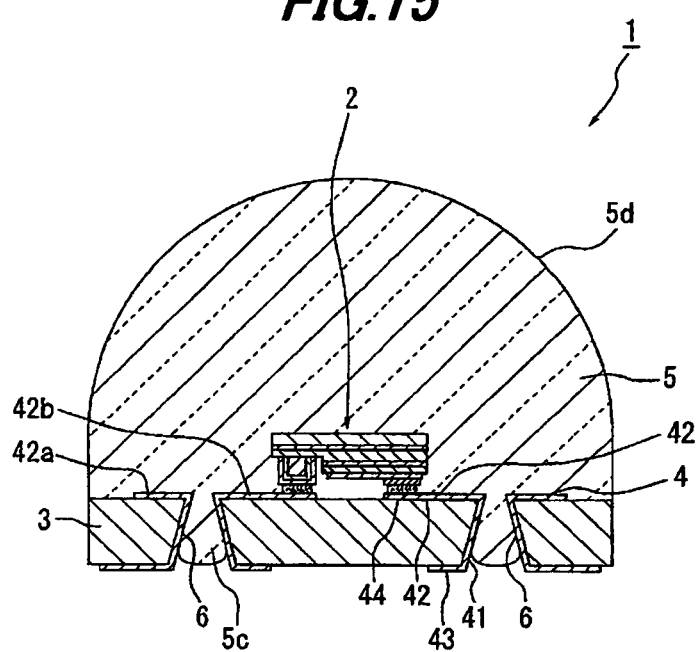
FIG. 15 is a schematic vertical cross sectional view showing a light-emitting device in a modification.

In addition, although the upper surface 5a of the glass sealing portion 5 which is formed parallel to the mounting substrate 3 has been described in the above-mentioned embodiment, the glass sealing portion 5 may have, e.g., an upper surface 5d formed in a curved shape as shown in FIG. 15. Even though the upper surface 5d of the glass sealing portion 5 is formed to be upwardly convex in the light-emitting device 1 of FIG. 15, it may be formed to be upwardly concave or plural curved surfaces may be formed as is, e.g., a Fresnel lens.

Figure 16:
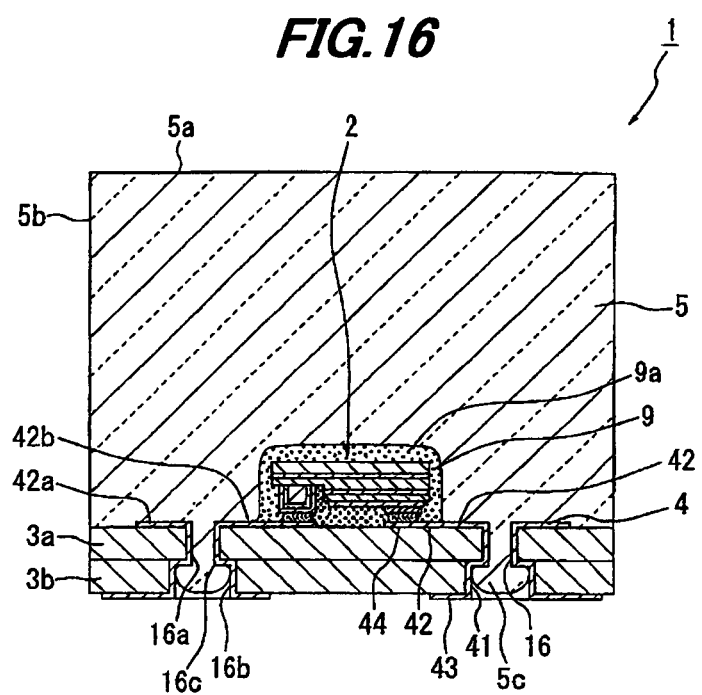
FIG. 16 is a schematic vertical cross sectional view showing a light-emitting device in a modification.
Figure 17:
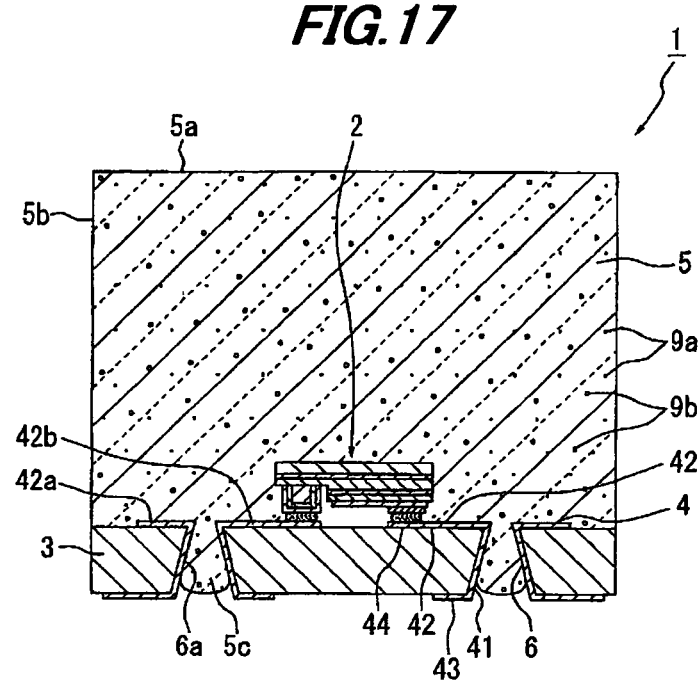
FIG. 17 is a schematic vertical cross sectional view showing a light-emitting device in a modification.

Alternatively, for example, a phosphor 9a for changing the wavelength of the light emitted from the LED element 2 can be contained as shown in FIGS. 16 and 17. As the phosphor 9a, it is possible to use, e.g., YAG (Yttrium Aluminum Garnet) phosphor, silicate phosphor and a mixture thereof mixed at a predetermined ratio, etc. In this case, a portion of the blue light emitted from the LED element 2 is converted into yellow light by the phosphor 9a in the glass sealing portion 5 and the remaining portion is radiated outside from the glass sealing portion 5 without wavelength conversion. Thus, the light radiated from the glass sealing portion 5 has peak wavelengths in a yellow region as well as in a blue region, and as a result, white light is radiated outside of the device. Alternatively, it may be configured to obtain the white light by a combination of a LED element emitting ultraviolet light with a blue phosphor, a green phosphor or a red phosphor.

In the light-emitting device 1 of FIG. 16, the LED element 2 is covered by an inorganic paste 9 containing the phosphor 9a and then is sealed with the glass material. The inorganic paste 9 can be made of, e.g., $SiO_2$, $Al_2O_3$ or $TiO_2$-based alkoxide or sol-gel glass. In case of using a GaN substrate as a substrate of the LED element 2, if the inorganic paste 9 is made of $TiO_2$-based alkoxide of which refractive index is higher than that of GaN, it is possible to efficiently perform wavelength conversion by the phosphor 9a while improving efficiency of light extraction from the LED element 2. In this case, the residual gas layer is more likely to be generated between the glass sealing portion 5 and the mounting substrate 3 at the time of hot pressing since a hollow portion between the LED element 2 and the mounting substrate 3 is not present, however, it is possible to maintain the satisfactory bonded state by forming an open through-hole 6. The open through-hole 6 is effective also in the case where the volume of the hollow portion between the LED element 2 and the mounting substrate 3 is reduced by mounting the LED element 2 using a eutectic material or a conductive adhesive, etc., without using a stud bump such as the Au bump 28, or directly mounting the LED element 2.

In the light-emitting device 1 of FIG. 17, the phosphor 9a is diffused into the glass material of the glass sealing portion 5. As shown in FIG. 17, the light-emitting device 1 includes diffusing particles 9b which are diffused into the glass sealing portion 5. As the diffusing particle 9b, it is possible to use, e.g., zirconia particle, alumina particle or silica particle, etc. The material of the diffusing particle is arbitrary, however, a white material is preferable from a viewpoint of permeability, and the melting point is preferably higher than a temperature during the processing from a viewpoint of stability during the glass processing.

Figure 18:
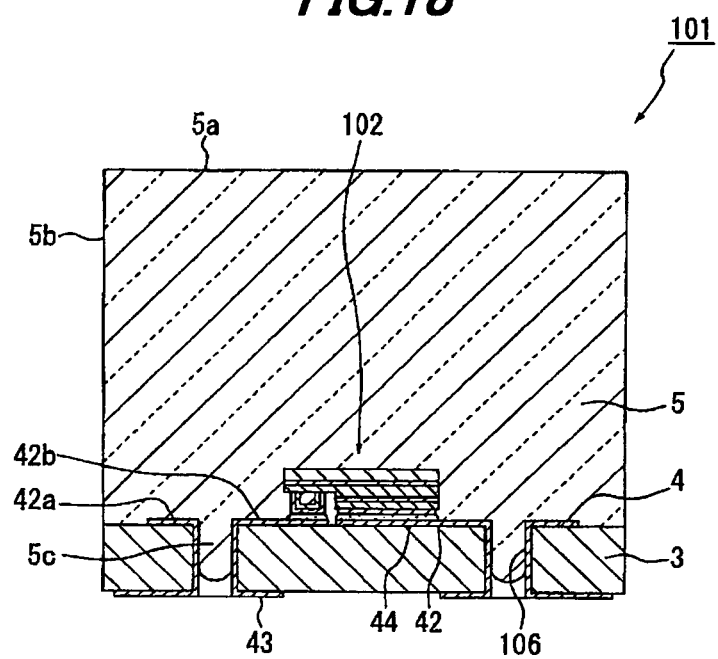
FIG. 18 is a schematic vertical cross sectional view showing a light-emitting device in a modification.
Figure 20:
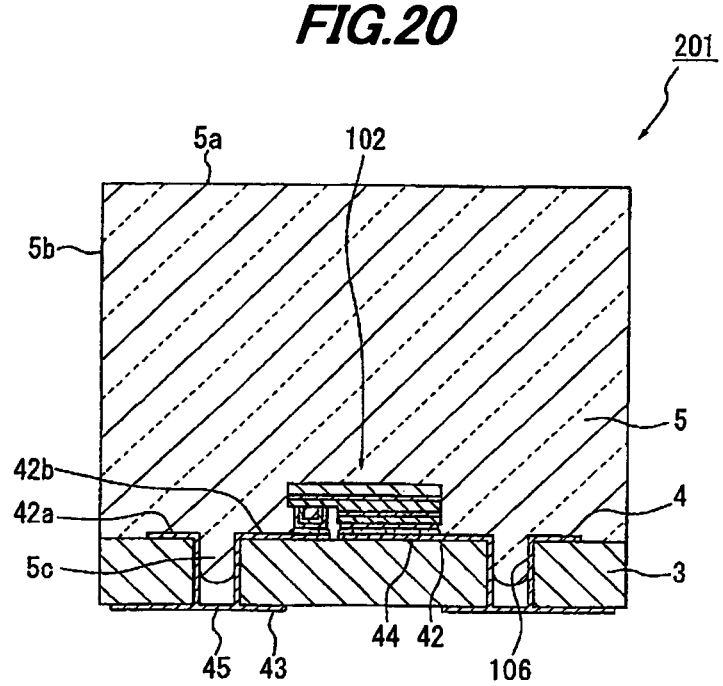
FIG. 20 is a schematic vertical cross sectional view showing a light-emitting device in a modification.

In addition, the through-hole 6 having the diameter enlarging portion 6b has been described in the above-mentioned embodiment, it may be a through-hole 106 having a constant diameter, for example, as shown in FIGS. 18 and 20. In a light-emitting device 101 of FIG. 18, the through-hole 106 is formed in a straight shape of which cross section is constant. This also makes possible to let out the gas between the glass material covering each LED element 2 of each light-emitting device 1 and the mounting substrate 3 at the time of hot pressing, the residual gas layer is prevented from being generated between the glass sealing portion 5 and the mounting substrate 3, which makes the bonded state satisfactory, and it is thereby possible to improve the strength. In addition, it is not necessary to seal in the reduced-pressure atmosphere or to provide a mechanism, etc., for eliminating the gas between the glass material and the mounting substrate 3, and it is thus possible to reduce the manufacturing cost.

In addition, since the pressure of the glass material on the mounting region is substantially constant during the glass sealing, it is possible to increase the pressure of the glass material at the outer rim of the mounting substrate 3, the bonding strength of the glass material to the mounting substrate 3 is increased and it is possible to suppress the separation of the grass material from the mounting substrate 3. In addition, the pressure applied to each LED element 2 in the mounting region can be constant. As a result, the sealing conditions of each LED element 2 can be uniform and characteristics of each LED element 2 can be thereby close to uniform. In this case, for example in the upper die 92 shown in FIG. 5, a gas layer between each of plural LED elements 2 mounted on the mounting substrate 3 is likely to remain since the periphery of the pre-sealing glass 11 not mounting the LED element 2 is previously blocked, however, the gas is eliminated through the through-hole 6 of the mounting substrate 3 to get rid of the gas layer between the glass and the mounting substrate 3 and it is thereby possible to obtain satisfactory bonding. It is also possible to obtain the same effect when the outflow of the glass material is controlled by means of providing a frame member around the pre-sealing glass 11 or providing a convex step portion at the edge of the mounting substrate 3, etc., besides the upper die 92 shown in FIG. 5.

Figure 19:
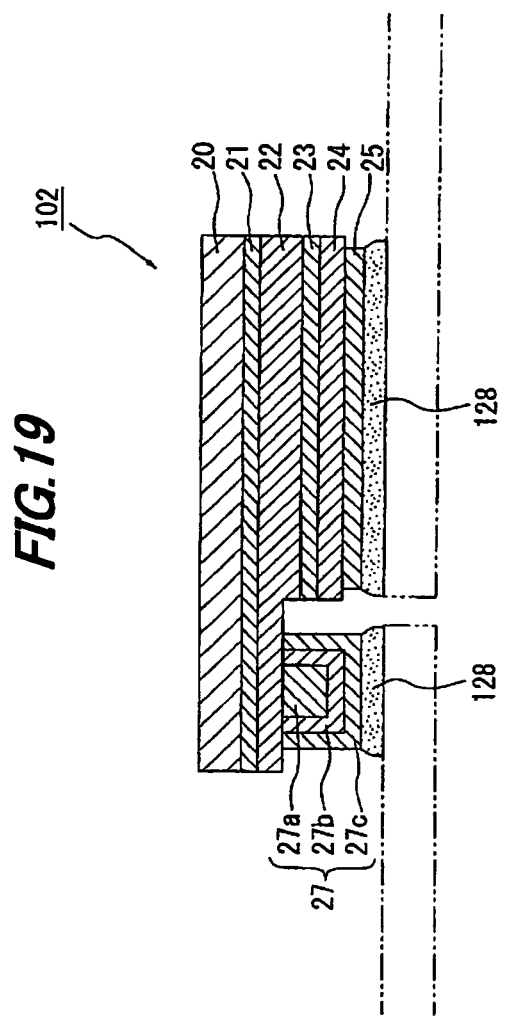
FIG. 19 is a vertical cross-sectional pattern diagram showing a LED element.

Meanwhile, a LED element 102 shown in FIG. 19 is used in the light-emitting device 101. The LED element 102 is electrically connected to the circuit pattern 4 by filling a conductive adhesive 128 under the p-side electrode 25 instead of the Au bump 28 which is used in the above-mentioned LED element 2, without forming the p-side pad electrode 26. The thickness of the conductive adhesive 128 is, e.g., 50 μm or less. Meanwhile, the area of the conductive adhesive 128 is, e.g., 50% or more of the LED element 102 when viewed from the top. As described above, the residual gas layer is more likely to be generated between the glass sealing portion 5 and the mounting substrate 3 at the time of hot pressing when the hollow portion between the LED element 102 and the mounting substrate 3 is small, however, it is possible to maintain the satisfactory bonded state by forming an open through-hole 106. Alternatively, the LED element 102 may be mounted using a eutectic material instead of the conductive adhesive 128, or, the LED element 102 may be mounted directly.

For example in the light-emitting device 101, the through-hole 106 is formed in, e.g., a green sheet forming the mounting substrate 3 by a press die. Then, the green sheet is calcined after W-paste is applied to a region corresponding to the circuit pattern 4, and Ni plating and plating of Au or Ag, etc., are applied thereto, thereby forming a ceramic mounting substrate 3. Alternatively, after the green sheet having the through-hole 106 formed therein is directly calcined, Ag paste is applied and calcined, thereby making the mounting substrate 3 having the circuit pattern 4 formed thereon.

Alternatively, as shown in FIG. 20, the circuit pattern 4 of a light-emitting device 201 may have a blocking pattern 45 for blocking the lower side of the through-hole 106. For example, when the circuit pattern 4 made of Ag paste is formed after formation of the through-hole 106, the inner surface pattern 41 and the front surface pattern 42 are formed for the first time, the diameter of the through-hole 106 is reduced for the second time, and then, a blocking pattern 45 can be formed together with the back surface pattern 43.

In addition, although the light-emitting device 1 using the LED element 2 formed of a GaN-based semiconductor material has been explained in the above-mentioned embodiment, the LED element is not limited to the GaN-based LED element 2 and it may be a light-emitting element formed of another semiconductor material such as, e.g., ZnSe-based or SiC-based material. In addition, emission wavelength of the LED element 2 is also arbitrary, and the LED element 2 may emit green light, yellow light, orange light or red light, etc.

Furthermore, although the glass sealing portion 5 in the above-mentioned embodiment is excellent in weather resistance, the glass sealing portion 5 may be altered when dew condensation occurs depending on the use conditions, etc., of the device. On the other hand, although the device configuration in which dew condensation does not occur is desirable, it is possible to prevent the glass alteration due to the dew condensation in a high temperature condition by applying silicone resin coating to a surface of the glass sealing portion 5. Moreover, a coating material applied to the surface of the glass sealing portion 5 is preferably e.g., an inorganic material such as, e.g., $SiO_2$-base or $Al_2O_3$-base which has not only moisture resistance but also resistance to acids and alkalis.

Furthermore, although it is shown that the pressure is applied to the mounting substrate 3 and the glass sealing portion 5 by the upper die 92 and the lower die 91 in the above-mentioned embodiment, it is possible to use the lower die 91 as a fixed member and to perform the glass sealing process only by the upper die 92.

Alternatively, in the glass sealing portion 5 of the above-mentioned embodiment, it is possible to use $B_2O_3$—$SiO_2$—$Li_2O$—$Na_2O$—$ZnO$—$Nb_2O_5$-based glass and the refractive index of glass may be further increased by using $Bi_2O_3$ as a part of ZnO composition of the glass. The refractive index of the glass is preferably 1.8. In addition, when the glass having the refractive index of 1.8 is used, it is preferable to use a light-emitting element in which the refractive index of the substrate (nd) is 1.8 or more since it is possible to improve the luminous efficiency by improving the efficiency of the light extraction from the light-emitting element. The light-emitting element in which the refractive index of the substrate is 1.8 or more includes a light-emitting element in which a GaN-based semiconductor is formed on, e.g., a $Ga_2O_3$ substrate, a GaN substrate or a SiC substrate, etc. In addition, the used glass is not limited to a bulk state, and it may be glass formed by solidifying powder, etc. Once the glass material becomes the high viscosity state by heating, a difference because of the pre-process state is not seen.

Alternatively, although it is shown that the mounting substrate 3 is formed of alumina ($Al_2O_3$) in the above-mentioned embodiment, it may be formed of ceramic other than alumina. Here, as a ceramic substrate formed of a highly heat-conductive material which is more excellent in heat resistance than alumina, for example, BeO (thermal expansion coefficient α: $7.6 \times 10^{-6}$/° C., heat conductivity: 250 W/(m·k)) may be used. It is possible to obtain good sealing properties by the pre-sealing glass also in the substrate formed of BeO.

Furthermore, for example, a W—Cu substrate may be used as another highly heat-conductive material substrate. By using a W90-Cu10 substrate (thermal expansion coefficient α: $6.5 \times 10^{-6}$/° C., heat conductivity: 180 W/(m·k)) or a W85-Cu15 substrate (thermal expansion coefficient α: $7.2 \times 10^{-6}$/° C., heat conductivity: 190 W/(m·k)) as the W—Cu substrate, it is possible to impart high heat conductivity while ensuring good bond strength to the glass sealing portion, and it is thereby possible to easily deal with a large amount of light and high output of the LED.

In addition, although a light-emitting device using a LED element as a light-emitting element has been explained in the above-mentioned embodiment, the light-emitting element is not limited to the LED element. In addition, the lower die 91 is not necessarily required, the die may be only the upper die 92, and other specific detailed structure, etc., can be, of course, appropriately changed.

Although the invention has been described with respect to the specific embodiment for complete and clear disclosure, the appended claims are not to be therefore limited but are to be construed as embodying all modifications and alternative constructions that may occur to one skilled in the art which fairly fall within the basic teaching herein set forth.

What is claimed is:

1. A method of manufacturing a light-emitting device, the light-emitting device comprising a plurality of light-emitting elements mounted on a surface of a mounting substrate and sealed with an inorganic material, the method comprising:
   a hole forming process for forming a through-hole for each of the plurality of light-emitting elements that continues from a front surface to a back surface of the mounting substrate;
   a pattern forming process for continuously forming a circuit pattern on an inner surface of the through-hole in the mounting substrate, from an end portion of the through-hole on the front surface of the mounting substrate to a mounting portion of the plurality of light-emitting elements, and on a periphery of the through-hole on the back surface of the mounting substrate;
   a mounting process for mounting the plurality of light-emitting elements on the mounting portion of the mounting substrate; and
   a hot pressing process in that the inorganic material softened by heating is placed on the surface of the mounting substrate and is advanced into the through-hole for each of the plurality of light-emitting elements while sealing the plurality of light-emitting elements by pressing and bonding the inorganic material to the surface of the mounting substrate, wherein the inorganic material has a viscosity sufficient to keep the inorganic material from reaching the end portion of the through-hole on a back side in the hot pressing process, wherein the pressing of the inorganic material is conducted by using a die that comprises a flat surface to contact with the inorganic material and an outflow control portion formed at an outer rim of the flat surface and comprising a tip portion not to contact with the mounting substrate, and wherein the outflow control portion is configured to control the outflow of the inorganic material before the sealing.

2. The method according to claim 1, wherein the through-hole formed in the hole forming process comprises a diameter enlarging portion that has a diameter enlarged toward a back surface side, and the inorganic material is advanced at least into the diameter enlarging portion of the through-hole in the hot pressing process.

3. The method according to claim 2, wherein the through-hole formed in the hole forming process comprises a diameter reducing portion that has a diameter narrowed toward the back surface side.

4. The method according to claim 1, wherein a plurality of the light-emitting elements are mounted on the mounting substrate, and wherein the method further comprises dividing the inorganic material and the mounting substrate after solidification of the inorganic material that is softened in the hot pressing process.

5. The method according to claim 1, wherein a gap is formed between the inorganic material and the end portion of the through-hole on the back side.

6. The method according to claim 1, wherein the inorganic material has a glass transition temperature that is lower than a heat resistance temperature of the light-emitting element.

7. The method according to claim 1, wherein the inorganic material has a thermal expansion coefficient that is equivalent to a thermal expansion coefficient of the mounting substrate.

8. The method according to claim 1, wherein the inorganic material has a glass transition temperature that is lower than a formation temperature of a light-emitting layer of the light-emitting element.

9. The method according to claim 1, wherein the inorganic material has a glass transition temperature that is 200° C. or more lower than a formation temperature of a light-emitting layer of the light-emitting element.

10. The method according to claim 1, further comprising providing a die having an outflow control portion, said outflow control portion controlling outflow of the inorganic material during said hot pressing process.

11. The method according to claim 1, further comprising:
disposing a solder on a bottom surface of the inorganic material, said solder extending from the bottom surface of the inorganic material to a bottom surface of the circuit pattern.

12. The method according to claim 11, wherein said solder continuously extends from the bottom surface of the inorganic material to the bottom surface of the circuit pattern.

13. The method according to claim 11, wherein said disposing said solder comprises filling a space between the end portion of the through-hole and the bottom surface of the inorganic material.

14. A method of manufacturing a light-emitting device, the light-emitting device comprising a light-emitting element mounted on a surface of a mounting substrate and sealed with an inorganic material, the method comprising:

a hole forming process for forming a through-hole that continues from a front surface to a back surface of the mounting substrate;

a pattern forming process for continuously forming a circuit pattern on an inner surface of the through-hole in the mounting substrate, from an end portion of the through-hole on the front surface of the mounting substrate to a mounting portion of the light-emitting element, and on a periphery of the through-hole on the back surface of the mounting substrate;

a mounting process for mounting the light-emitting element on the mounting portion of the mounting substrate;

a hot pressing process in that the inorganic material softened by heating is placed on the surface of the mounting substrate and is advanced into the through-hole while sealing the light-emitting element by pressing and bonding the inorganic material to the surface of the mounting substrate; and disposing a solder on a bottom surface of the inorganic material, said solder extending from the bottom surface of the inorganic material to a bottom surface of the circuit pattern, wherein the inorganic material has a high viscosity sufficient to keep the inorganic material from reaching an end portion of the through-hole on a back side in the hot pressing process, wherein the through-hole comprises:
a diameter reducing portion that has a diameter narrowed toward the end portion of the through-hole; and
a diameter enlarging portion that has a diameter enlarged toward the end portion of the through-hole, and wherein the inorganic material fills the diameter reducing portion and said solder is disposed inside the diameter enlarging portion.

15. The method according to claim 14, wherein an upper surface of said solder is located below a portion of the through-hole in which the diameter reducing portion connects to the diameter enlarging portion.

16. The method according to claim 14, wherein the bottom surface of the inorganic material is located inside the diameter enlarging portion.

17. A light-emitting device, comprising:
a light-emitting element mounted on a surface of a mounting substrate and sealed with an inorganic material;
a through-hole that continues from a front surface to a back surface of the mounting substrate;
a circuit pattern continuously formed on an inner surface of the through-hole in the mounting substrate, from an end portion of the through-hole on the front surface of the mounting substrate to a mounting portion of the light-emitting element, and on a periphery of the through-hole on the back surface of the mounting substrate; and
an inorganic sealing portion that seals the light-emitting element on the surface of the mounting substrate and comprises an engaging portion advanced into the through-hole, wherein the inorganic material has a viscosity sufficient to keep the inorganic material from reaching the end portion of the through-hole on a back surface side, wherein the through-hole comprises a diameter reducing portion that has a diameter narrowed toward the back surface side of the mounting substrate and a diameter enlarging portion that has a diameter enlarged toward the back surface side, and wherein the engaging portion of the inorganic sealing portion is advanced into the diameter enlarging portion of the through-hole and does not reach the end portion of the through-hole.

18. A method of mounting a light-emitting device, comprising:

mounting the light-emitting device according to claim 17 on a mounting board; and bonding, via a solder or directly, the circuit pattern formed at the periphery of the through-hole on the back surface of the mounting substrate of the light-emitting device to a circuit pattern on the mounting board.

19. A lighting device, comprising:

the light-emitting device according to claim 17;

a mounting board for mounting the light-emitting device; and a solder comprising an intruded portion interposed between the circuit pattern formed at the periphery of the through-hole on the back surface of the mounting substrate of the light-emitting device and the circuit pattern of the mounting board, the intruded portion being intruded into the through-hole.

* * * * *